(12) United States Patent
Sugawara et al.

(10) Patent No.: US 7,601,447 B2
(45) Date of Patent: Oct. 13, 2009

(54) ELECTROLYTE-ELECTRODE ASSEMBLY COMPRISING AN ISOTROPIC LAYER

(75) Inventors: Masayuki Sugawara, Asaka (JP); Yoshikatsu Higuchi, Niiza (JP)

(73) Assignee: Honda Motor Co., Ltd., Tokyo (JP)

( * ) Notice: Subject to any disclaimer, the term of this patent is extended or adjusted under 35 U.S.C. 154(b) by 828 days.

(21) Appl. No.: 10/988,298

(22) Filed: Nov. 12, 2004

(65) Prior Publication Data
US 2005/0100770 A1 May 12, 2005

(30) Foreign Application Priority Data
Nov. 12, 2003 (JP) ............... 2003-382568
Nov. 12, 2003 (JP) ............... 2003-382588

(51) Int. Cl.
*H01M 8/10* (2006.01)
(52) U.S. Cl. ........................... 429/30; 429/33
(58) Field of Classification Search ....................... None
See application file for complete search history.

(56) References Cited

U.S. PATENT DOCUMENTS

| | | | |
|---|---|---|---|
| 6,004,688 A | 12/1999 | Goodenough et al. | |
| 6,232,009 B1 * | 5/2001 | Batawi | 429/40 |
| 7,125,622 B2 * | 10/2006 | Nakayama et al. | 429/33 |

FOREIGN PATENT DOCUMENTS

| | | |
|---|---|---|
| EP | 1168478 A2 | 1/2002 |
| EP | 1202369 A1 | 5/2002 |
| EP | 1351326 A2 | 10/2003 |
| JP | 08-208333 | 8/1996 |
| JP | 11-071169 | 3/1999 |
| JP | 11-130595 | 5/1999 |
| JP | 2000-329729 | 11/2000 |
| JP | 2002-252005 | 9/2002 |
| WO | WO-02/17420 A2 | 2/2002 |

OTHER PUBLICATIONS

Factors controlling the oxide ion conductivity of fluorite and perovskite structured oxides, Mogensen et al., Solid State Ionics, vol. 174, Issues 1-4, Oct. 29, 2004, pp. 279-286. Available online at: http://www.sciencedirect.com/science?_ob=ArticleURL&_ udi=B6TY4-4DTSM46-1&_user=2502287&_rdoc=1&_fmt=&_ orig=search&_sort=d&view=c&_acct=C0000551.*

(Continued)

*Primary Examiner*—Dah-Wei D Yuan
*Assistant Examiner*—Adam A Arciero
(74) *Attorney, Agent, or Firm*—Lahive & Cockfield, LLP; Anthony A. Laurentano, Esq.; Brian C. Trinque

(57) ABSTRACT

An electrolyte is single crystal composed of $La_{9.33}Si_6O_{26}$ in which the crystal is oriented in the c-axis, and the c-axis is in the thickness direction of the electrolyte. In the electrolyte, the oxide ion is preferentially migrated in the thickness direction. That is, the oxide ion conduction exhibits anisotropy. Isotropic conductive layers composed of YDC, in which the oxide ion conduction exhibits isotropy and the oxide ion conductivity is lower than that of the electrolyte, are provided between the electrolyte and an anode and a cathode.

17 Claims, 10 Drawing Sheets

OTHER PUBLICATIONS

Muller, C. et al., "Pressure and magnetic field effects on the crystallographic texture and electrical conductivity of the $Bi_4(V_{0.85}Co_{0.15})_2O_{11-\delta}$ compound," *J. Phys. D: Appl. Phys.*, vol. 29:3106-3112 (1996).

Virkar, Anil V., "Theoretical Analysis of Solid Oxide Fuel Cells with Two Layer, Composite Electrolytes: Low Temperature SOFC'S," 1046b Extended Abstracts, Fall Meeting, Seattle, Washington 90/2, p. 173, Abstract No. 113 (1990).

Yahiro, Hidenori et al., "High Temperature Fuel Cell with Ceria-Yttria Solid Electrolyte," *Journal of the Electrochemical Society*, vol. 135:2077-2080 (1988).

European Office Action for Application No. 04257041.6-1227, dated Apr. 21, 2008.

\* cited by examiner

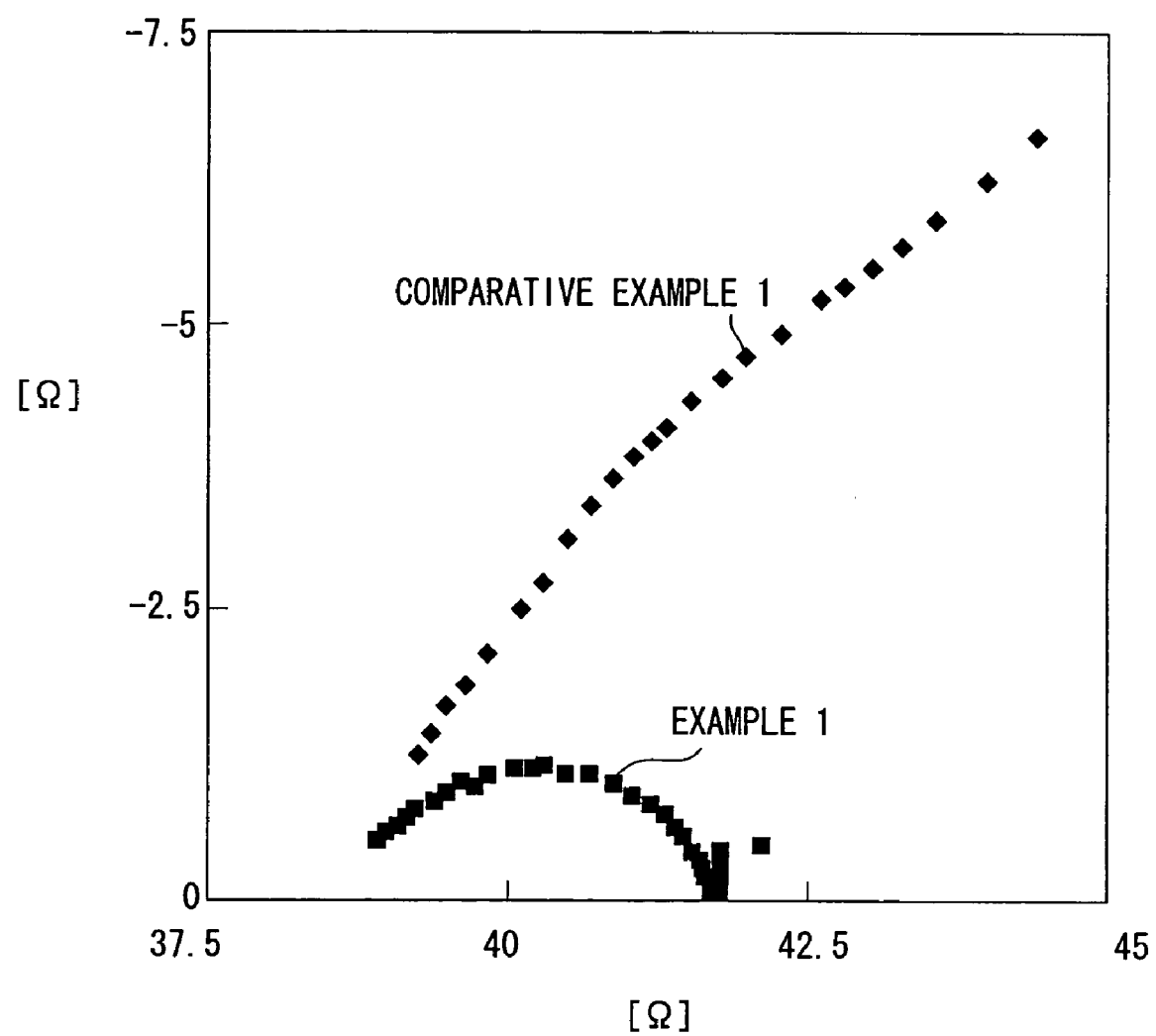

ELECTROLYTE-ELECTRODE ASSEMBLY COMPRISING AN ISOTROPIC LAYER

BACKGROUND OF THE INVENTION

1. Field of the Invention

The present invention relates to an electrolyte-electrode assembly, preferably usable for a fuel cell, which comprises an electrolyte interposed between an anode and a cathode, and a method for producing the same.

2. Description of the Related Art

As concern over environmental protection is increasing, fuel cells, which have low-pollution electric power supply sources, are attracting attention. In recent years, attempts have been made to adopt an oxide ion ($O^{2-}$) conductor as the electrolyte for the fuel cells. In this case, all parts of the fuel cell are constructed with solid materials, because the oxide ion conductor is a solid, therefore simplifying the structure. Further, liquid leakage is prevented from occurring, and hence the number of times needed for maintenance operation is extremely reduced.

Examples of the oxide ion conductor include stabilized $ZrO_2$ doped with about 8 mole % of $Y_2O_3$ (YSZ), fluorite type oxide such as $CeO_2$ doped with about 10 mole % of $Sm_2O_3$ (SDC), and perovskite type oxide such as $La_{0.9}Sr_{0.1}Ga_{0.8}Mg_{0.2}O_3$ and $BaTh_{0.9}Gd_{0.1}O_3$ and so on.

A high temperature of about 1,000° C. is required in order to quickly migrate the oxide ion through the oxide as described above to increase the oxide ion conductivity. Therefore, it is necessary to raise the operation temperature in the fuel cell.

In order to satisfactorily operate the fuel cell in a middle temperature region of about 500° C. to 800° C., an electrolyte preferably composed of a composite oxide (apatite type oxide) of rare earth element and Si is disclosed in Japanese Laid-Open Patent Publication Nos. 8-208333 and 11-71169. The apatite type oxide exhibits satisfactory oxide ion conductivity in the temperature region as described above.

In order to further improve the operation of the fuel cell, suggestions have been made in Japanese Laid-Open Patent Publication Nos. 8-208333 and 11-71169 to further improve the oxide ion conductivity of the apatite type oxide. Japanese Laid-Open Patent Publication No. 11-130595 discloses that the oxide ion conduction is made anisotropic by allowing the apatite type oxide to be single crystal, and thus the oxide ion conductivity is increased along with a specified plane or in a specified direction. Meanwhile, Japanese Laid-Open Patent Publication No. 2002-252005 suggests that the Si site of apatite type oxide is substituted with Ge.

However, particularly when the oxide ion conduction of the electrolyte is anisotropic, the oxide ion conductivity of the entire electrolyte-electrode assembly is not significantly improved, even when the electrolyte-electrode assembly is produced by providing the anode and the cathode on respective end surfaces of the electrolyte. In other words, the power generation performance of the fuel cell is not significantly improved even when the fuel cell is constructed by using the electrolyte which has anisotropic oxide ion conductivity.

SUMMARY OF THE INVENTION

A general object of the present invention is to provide an electrolyte-electrode assembly which exhibits excellent oxide ion conductivity even when an oxide ion conductor, in which oxide ion conduction exhibits anisotropy, is used as an electrolyte.

A principal object of the present invention is to provide an electrolyte-electrode assembly which significantly improves the power generation performance of a fuel cell at 500° C. to 800° C.

Another object of the present invention is to provide a method for producing the electrolyte-electrode assembly as described above.

According to one aspect of the present invention, there is provided an electrolyte-electrode assembly comprising an electrolyte interposed between an anode and a cathode, wherein the electrolyte is composed of a substance which provides a plane or a direction of migration of oxide ion in a crystal thereof when the substance is single crystal so that oxide ion conduction exhibits anisotropy thereby; and an isotropic conductive layer, in which oxide ion conduction exhibits isotropy, is provided between the electrolyte and at least one of the anode and the cathode.

In the present invention, the isotropic conductive layer, in which the oxide ion conduction exhibits isotropy, is provided on the surface of the electrolyte. Therefore, for example, the oxide ion, which is produced in the cathode, migrates straightly or obliquely via the isotropic conductive layer into the electrolyte. Therefore, the number of oxide ions migrated from the cathode to the electrolyte is increased.

On the other hand, on the side of the anode, the oxide ion is migrated through the electrolyte, and then the oxide ion passes straightly or obliquely through the isotropic conductive layer to arrive at the anode. Therefore, the number of oxide ions received by the anode is increased.

In other words, the oxide ion is migrated from the cathode to the electrolyte and from the electrolyte to the anode with ease. As a result, the oxide ion conductivity is improved in the entire electrolyte-electrode assembly, and the overvoltage is lowered. That is, the electrolyte-electrode assembly having excellent power generation performance is obtained.

In the present invention, the phrase "substance in which oxide ion conduction exhibits isotropy" refers to the substance in which the oxide ion conductivity is substantially the same or equivalent in any direction. On the other hand, the phrase "substance in which oxide ion conduction exhibits anisotropy" refers to the substance in which the oxide ion conductivity differs depending on the direction.

In the present invention, the electrolyte should be composed of the substance which shows anisotropy in the oxide ion conductivity when the substance is single crystal. The electrolyte itself may be polycrystalline in which the respective grains are gathered in a state in which the direction of migration of the oxide ion is irregular. That is, the individual crystals of the electrolyte exhibit anisotropy in the oxide ion conduction. It is not especially necessary for the entire electrolyte to be anisotropic in the oxide ion conduction.

However, it is preferable that the entire electrolyte is made of a substance in which the oxide ion conduction exhibits anisotropy. That is, it is preferable that the electrolyte is single crystal or polycrystalline in which crystals are oriented in the plane or the direction of the migration of the oxide ion, and the anode and the cathode are arranged in conformity with a plane or a direction in which the oxide ion conduction of the electrolyte is high. In this arrangement, it is preferable that the plane or the direction, in which the oxide ion conductivity is high in the electrolyte, substantially perpendicularly intersects the interface formed by the electrolyte and the electrode. Accordingly, the oxide ion conductivity of the electrolyte-electrode assembly is further improved.

Preferred examples of the substance for constructing the isotropic conductive layer include both of a fluorite type oxide and a perovskite type oxide.

Further, it is preferable that the isotropic conductive layer is composed of a mixed conductor which exhibits both oxide ion conduction and electron conduction. When the substance as described above is used, it is possible to facilitate the ionization reaction of oxygen in the cathode and the reaction to produce water in the anode. That is, the electrode reaction is facilitated. Therefore, the electrolyte-electrode assembly having excellent power generation performance is obtained.

According to another aspect of the present invention, there is provided an electrolyte-electrode assembly comprising an electrolyte interposed between an anode and a cathode, wherein a layer, which has an oxide ion conductivity lower than that of the electrolyte, is provided between the electrolyte and at least one of the anode and the cathode.

As described above, in the present invention, it is also possible to provide the layer with the substance which has the lower oxide ion conductivity than that of the electrolyte. Therefore, the material options are increased, and it is possible to construct the electrolyte-electrode assembly with a variety of materials.

Further, in this arrangement, the electrolyte, in which the oxide ion conduction exhibits anisotropy, is joined to the electrode via the layer in which the oxide ion conduction exhibits isotropy. Therefore, the oxide ion can be conducted to the electrolyte from an area which does not directly contact the electrode in the electrolyte, or the oxide ion can be conducted reversely from the electrode to the area. Accordingly, the overvoltage, which is generated between both of the electrodes, is extremely decreased. As a result, the power generation performance is improved for the electrolyte-electrode assembly. In other words, when the layer, which is composed of the substance having oxide ion conductivity lower than that of the electrolyte, is provided, the power generation performance is improved for the electrolyte-electrode assembly.

Preferred examples of the electrolyte include a substance which provides a plane or a direction of migration of oxide ion in a crystal thereof when the substance is single crystal so that oxide ion conduction exhibits anisotropy thereby.

Specified examples of the electrolyte include an apatite type oxide which contains a trivalent element A and a tetravalent element B, which has a composition formula represented by $A_xB_6O_{12+1.5x}$ provided that $8 \leqq x \leqq 10$ is satisfied, which has crystals belonging to a hexagonal system, and which has crystals oriented to be directed to a c-axis.

It is preferable that the element A is La. In this arrangement, the electrolyte-electrode assembly is obtained, which exhibits excellent oxide ion conductivity even in a temperature region of 500° C. to 800° C.

Further, it is preferable that the element B is Si or Ge. Accordingly, the electrolyte exhibits particularly excellent oxide ion conductivity. Consequently, the power generation performance of the electrolyte-electrode assembly is further improved.

On the other hand, it is preferable that the layer is composed of a substance in which oxide ion conduction exhibits isotropy. Accordingly, for example, the oxide ion coming from the cathode can be migrated to the conduction passage through which the oxide ion in the electrolyte is conducted via the layer in which the oxide ion conductivity exhibits isotropy. Therefore, the number of oxide ions capable of migrating from the cathode to the electrolyte is increased, and the overvoltage is decreased. Therefore, the electrolyte-electrode assembly is obtained, which exhibits particularly excellent power generation performance.

Preferred examples of the material for the layer include a fluorite type oxide or a perovskite type oxide.

Further, it is preferable that the layer is composed of a mixed conductor which exhibits both oxide ion conductivity and electron conductivity. When the substance as described above is used, it is possible to facilitate the ionization reaction of oxygen in the cathode and the reaction to produce water in the anode. That is, the electrode reaction is facilitated. Therefore, the electrolyte-electrode assembly having excellent power generation performance is obtained.

It is preferable that the electrolyte is single crystal or polycrystalline in which crystals are oriented in the plane or the direction of the migration of the oxide ion, and the anode and the cathode are arranged in conformity with a plane or a direction in which the oxide ion conductivity of the electrolyte is high. In this arrangement, it is preferable that the arrangement is made so that the plane or the direction, in which the oxide ion conductivity is high in the electrolyte, substantially perpendicularly intersects the interface formed by the electrolyte and the electrode. Accordingly, the power generation performance is further improved.

According to still another aspect of the present invention, there is provided a method for producing an electrolyte-electrode assembly comprising an electrolyte interposed between an anode and a cathode, the method comprising:

a step of preparing the electrolyte composed of a substance which provides a plane or a direction of migration of oxide ion in a crystal thereof when the substance is single crystal so that oxide ion conduction exhibits anisotropy thereby;

a step of providing, on at least one end surface of the electrolyte, an isotropic conductive layer in which oxide ion conduction exhibits isotropy; and a step of arranging at least one of the anode and the cathode on the electrolyte or the isotropic conductive layer.

According to the production method as described above, it is possible to easily and stably produce the self-standing or self-supported membrane type electrolyte-electrode assembly which has the isotropic conductive layer and hence which exhibits particularly excellent power generation performance.

According to still yet another aspect of the present invention, there is provided a method for producing an electrolyte-electrode assembly comprising an electrolyte interposed between an anode and a cathode, the method comprising:

a first step of providing any one of the anode and the cathode;

a second step of providing the electrolyte composed of a substance which provides a plane or a direction of migration of oxide ion in crystals thereof so that oxide ion conduction exhibits anisotropy thereby; and a third step of providing the other of the anode and the cathode, wherein a step of providing an isotropic conductive layer in which oxide ion conduction exhibits isotropy is carried out at least between the first step and the second step or between the second step and the third step.

In this production method, it is possible to provide the electrolyte while decreasing the thickness of the electrolyte. In this procedure, the volume resistance of the electrolyte is decreased in addition to the provision of the isotropic conductive layer. Therefore, the oxide ion conductivity is improved. As a result, it is possible to obtain the electrode-supported membrane type electrolyte-electrode assembly which exhibits particularly excellent power generation characteristics.

It is preferable that the electrolyte is single crystal or polycrystalline in which crystals are oriented in the plane or the direction of the migration of the oxide ion, and the anode and the cathode are arranged in conformity with a plane or a direction in which the oxide ion conductivity of the electrolyte is high. Further, it is preferable that the arrangement is made so that the plane or the direction, in which the oxide ion conductivity is high in the electrolyte, substantially perpendicularly intersects the interface formed by the electrolyte and the electrode. Accordingly, the electrolyte-electrode assembly, which is particularly excellent in the power generation performance, is produced.

Preferred examples of the material for the isotropic conductive layer include both a fluorite type oxide and a perovskite type oxide.

It is preferable that the isotropic conductive layer is prepared with a mixed conductor which exhibits both oxide ion conduction and electron conduction, because the electrode reaction is facilitated.

According to the present invention, the isotropic conductive layer is provided between the electrode and the electrolyte. Therefore, the migration of the oxide ion from the electrode to the electrolyte or the migration in the opposite direction are effected with ease. Further, the overvoltage is decreased based on the decrease of the interface reaction resistance between the electrode and the electrolyte. Therefore, the electrolyte-electrode assembly, which is excellent in the power generation performance, is obtained.

In the present invention, the substance, which has the conductivity lower than that of the electrolyte, can be also selected as the material for the isotropic conductive layer provided between the electrode and the electrolyte. Therefore, the material options are increased. Accordingly, it is possible to construct the electrolyte-electrode assembly with a variety of materials. In particular, when the substance such as the apatite type oxide to exhibit the excellent oxide ion conduction in the c-axis direction, which is particularly excellent in the oxide ion conduction at 500° C. to 800° C., is selected as the material for the electrolyte, the electrolyte-electrode assembly, which exhibits the excellent power generation performance, is obtained.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 10 is a plot obtained by magnifying major parts of the Cole-Cole plot shown in FIG. 9.

DESCRIPTION OF THE PREFERRED EMBODIMENTS

Figure 1:
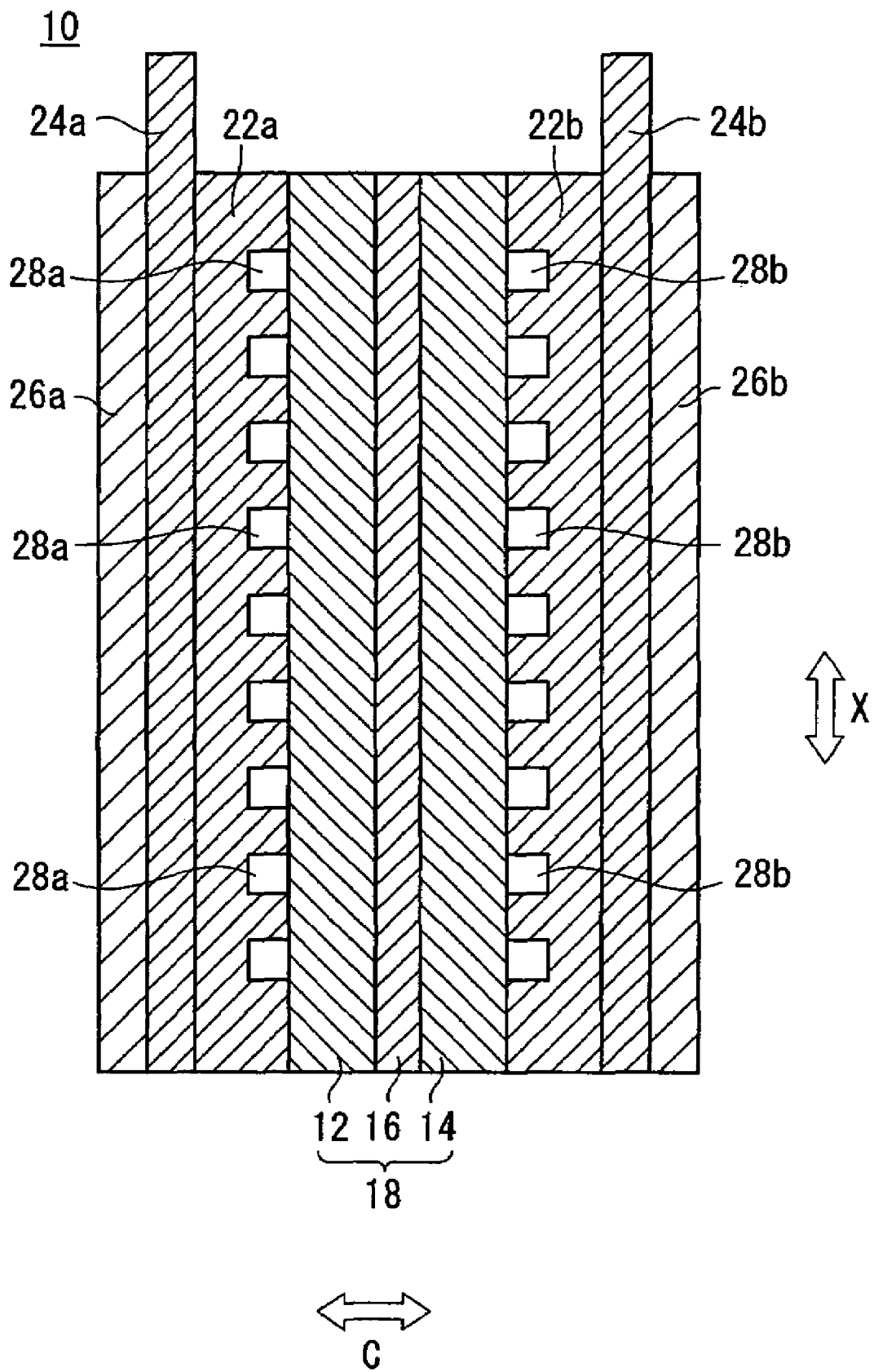
FIG. 1 is a schematic vertical sectional view illustrating a power-generating cell of a fuel cell provided with an electrolyte-electrode assembly according to an embodiment of the present invention.

The present inventors have focused on the fact that the electrode for the fuel cell is prepared as the porous member in order to easily diffuse the supplied gas inside of the electrode, during intensive research to achieve the objects as described above.

The present inventors have made the following speculation on the basis of the foregoing viewpoint. Since minute pores exist in the electrode as the porous member, hence minute recesses and projections exist on the surface of the electrode. For this reason, the electrode makes contact with the electrolyte only at the projections. In other words, the contact is only regionally made between the electrolyte and the electrode. Therefore, the oxide ion is produced, and the migration of the oxide ion from the electrolyte to the electrode or reversely from the electrode to the electrolyte occur only at portions at which the electrolyte and the electrode regionally contact each other. On the other hand, no passage is formed to cause the oxide ion conduction at portions at which the electrolyte and the electrode make no contact with each other. Therefore, the oxide ion conduction is inhibited. The inhibition of the conduction is enhanced in the situation in which the electrolyte is composed of the substance that exhibits anisotropy for the oxide ion conduction as compared with the situation in which the electrolyte is composed of the substance that exhibits isotropic oxide ion conduction. Therefore, when the electrolyte is composed of the substance that exhibits anisotropy for the oxide ion, the actual power generation performance of the fuel cell is lower than the power generation performance expected from the oxide ion conductivity of the electrolyte.

The present inventors have made intensive research on the basis of the speculation as described above, and therefore figured that the oxide ion is smoothly sent and received between the electrolyte and the electrode by providing the conductive layer between the electrolyte and the electrode, wherein the conductive layer exhibits isotropy for the oxide ion conduction.

Conventionally, an intermediate layer has been provided between the electrolyte and the electrode in order to avoid the mutual reaction between the electrolyte and the electrode. A material, which has a conductivity higher than that of the electrolyte, is selected for the intermediate layer. For example, when the electrolyte is composed of a material of YSZ, the electrode is composed of a material of LSCF as an La—Sr—Co—Fe—O-based perovskite type oxide, and the interconnect containing Cr is used, then an intermediate layer, which is composed of $CeO_2$ doped with Sm (SDC) having a conductivity higher than that of YSZ for the electrolyte, is provided in order to suppress the diffusion of Cr to the electrolyte.

The reason why the intermediate layer is provided with the substance having the conductivity higher than that of the electrolyte in the case of the electrolyte in which the oxide ion conduction exhibits isotropy, is that the effect to improve the conductivity cannot be observed at all, although the diffusion of the component is suppressed by forming the intermediate layer. That is, when the conductivity of the intermediate layer is lower than that of the electrolyte, then the migration of the oxide ion in the intermediate layer is rate-limiting, and the conductivity is consequently decreased as the electrolyte-electrode assembly. Therefore, in the conventional technique, an intermediate layer with a substance having conductivity lower than that of the electrolyte is not provided.

The present inventors have repeatedly performed intensive research in view of the foregoing viewpoint, and thus have come up with the present invention.

The electrolyte-electrode assembly and the method for producing the same according to the present invention will be explained in detail below with reference to the accompanying drawings as exemplified by preferred embodiments.

FIG. 1 shows a schematic vertical sectional view illustrating a power-generating cell of a fuel cell provided with an electrolyte-electrode assembly according to an embodiment of the present invention. In the power-generating cell 10, an electrolyte 16 is interposed between an anode 12 and a cathode 14, each of which is composed of Pt. These components are joined together, and thus the electrolyte-electrode assembly 18 is constructed.

Figure 2:
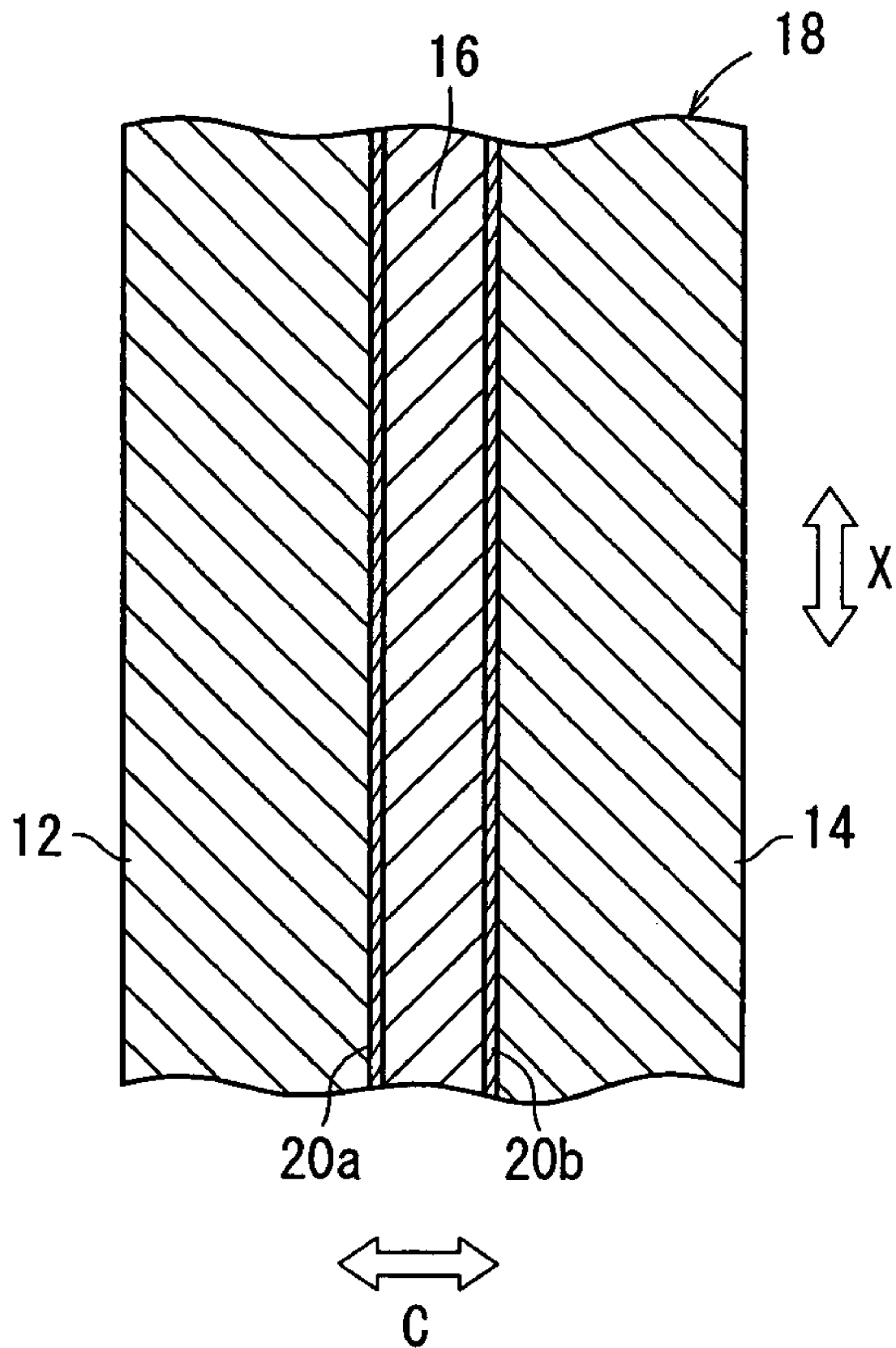
FIG. 2 is a magnified view illustrating major parts shown in FIG. 1.

As shown in FIG. 2 with partial magnification, the electrolyte-electrode assembly 18 further includes isotropic conductive layers 20a, 20b which are provided between the electrolyte 16 and the anode 12 and between the electrolyte 16 and the cathode 14, respectively.

In this arrangement, the electrolyte 16 is single crystal composed of $La_{9.33}Si_6O_{26}$ containing La as a trivalent element and Si as a tetravalent element. This substance has an apatite type structure in which the crystals belong to the hexagonal system and the crystals are oriented to be directed to the c-axis.

In the crystals of the electrolyte 16 as described above, the oxide ion is migrated in the c-axis direction. Therefore, the oxide ion conductivity is increased in the c-axis direction, and the oxide ion conductivity is decreased in the a-axis direction and the b-axis direction. That is, the oxide ion conduction exhibits anisotropy.

As shown by the arrow C in FIG. 2, the c-axis direction is the thickness direction of the electrolyte 16 in this embodiment. That is, the anode 12 and the cathode 14 are arranged perpendicularly to the direction in which the oxide ion conductivity is the highest in the electrolyte 16. Therefore, the oxide ion is quickly migrated from the cathode 14 to the anode 12.

Figure 3:
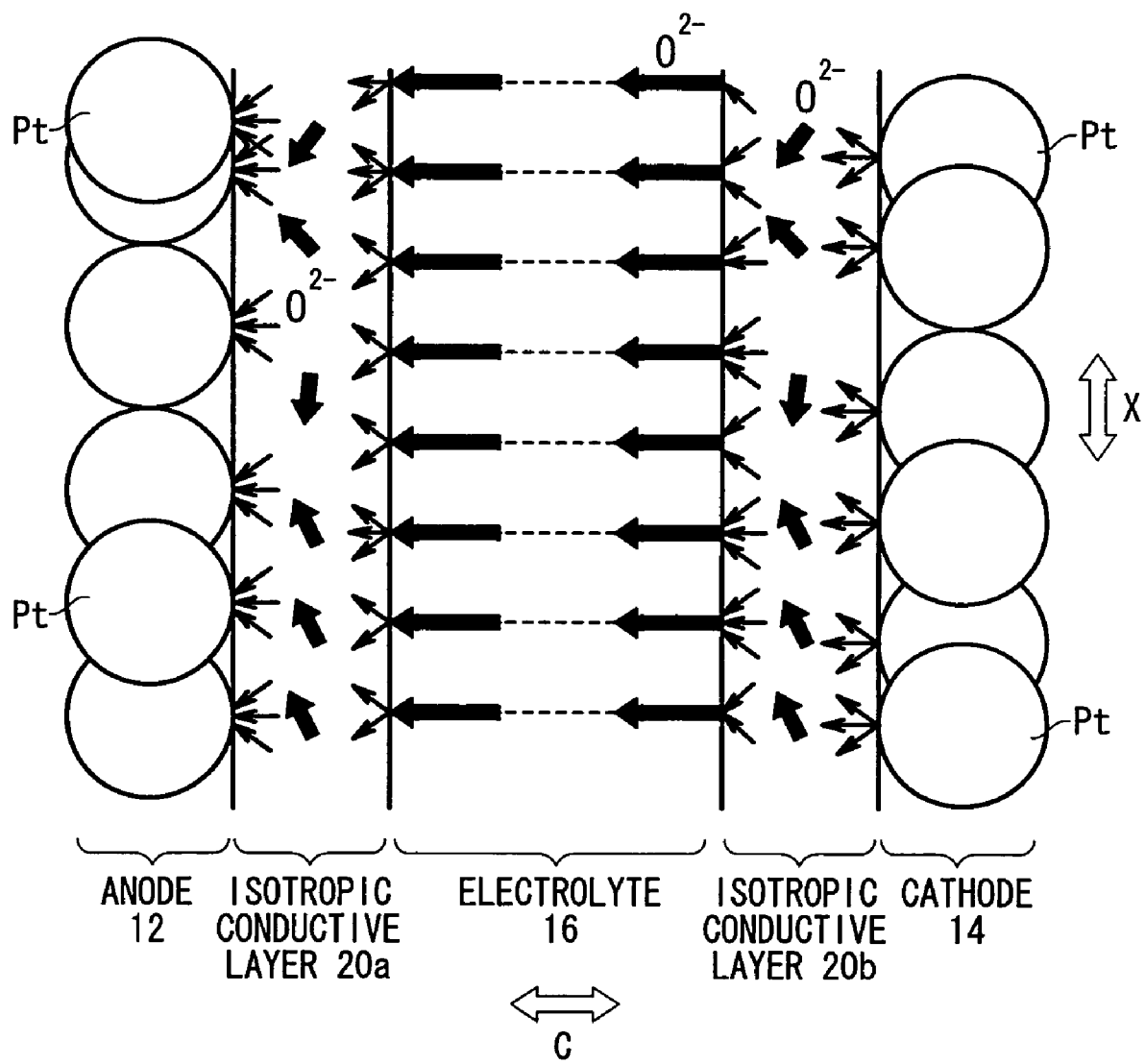
FIG. 3 is a magnified view illustrating major parts shown in FIG. 2.

FIG. 3 schematically shows the electrolyte-electrode assembly 18 provided with the isotropic conductive layers 20a, 20b. In this embodiment, the isotropic conductive layers 20a, 20b are composed of $CeO_2$ doped with about 5 mole % of $Y_2O_3$ (YDC). The thickness of the isotropic conductive layers 20a, 20b may be appropriately set depending on the thickness of the electrolyte 16. For example, when the thickness of the electrolyte 16 is extremely thin, the thickness of the isotropic conductive layers 20a, 20b may be equivalent to the thickness of the electrolyte 16. When the thickness of the electrolyte 16 is increased, the thickness of the isotropic conductive layers 20a, 20b may be about $1/1,000$ of the thickness of the electrolyte 16.

It is preferable that the porosity of the isotropic conductive layers 20a, 20b is small, for the following reason. That is, if the porosity is excessively large, then the effect based on the isotropic ion conduction disappears in some cases, or the oxide ion conductivity is lowered in other cases. Specifically, the porosity is preferably not more than 20% by volume and more preferably not more than 10% by volume.

The oxide ion conduction of YDC is isotropic. Therefore, in the isotropic conductive layer 20a, the oxide ion conductivity is substantially equivalent in the thickness direction (C direction in FIGS. 1 to 3) and the vertical direction (X direction in FIGS. 1 to 3).

The oxide ion conductivity of YDC is lower than the oxide ion conductivity of $La_{9.33}Si_6O_{26}$ for constructing the electrolyte 16. That is, the oxide ion conductivity in the isotropic conductive layers 20a, 20b is lower than that in the thickness direction of the electrolyte 16.

For example, it has been hitherto carried out that an intermediate layer composed of, for example, $CeO_2$ doped with Sm (SDC) to intervene between the electrode and the electrolyte composed of YSZ. However, this conventional technique intends to avoid any mutual reaction between YSZ in which the oxide ion conduction is isotropic even in single crystal and the constitutive materials for the electrode. In this arrangement, in order not to deteriorate the power generation performance of the cell, SDC, which is particularly excellent in the conductivity than YSZ, is adopted as the material for the intermediate layer.

As described above, the embodiment of the present invention is different from the conventional technique in that the isotropic conductive layers 20a, 20b, which are composed of the substance with the oxide ion conductivity lower than that of the electrolyte 16, are provided between the electrolyte 16 and both of the electrodes 12, 14 and in that the apatite type oxide, which constitutes the electrolyte 16, is the substance that exhibits anisotropy for the oxide ion conduction when the substance is single crystal. That is, according to the embodiment of the present invention, even the substance, in which the oxide ion conductivity is lower than that of the electrolyte 16, can be selected as the material for the isotropic conductive layers 20a, 20b. Therefore, the options are increased for the constitutive material for the isotropic conductive layers 20a, 20b.

The oxide ion conductivity from the cathode 14 to the anode 12 is remarkably improved by providing the isotropic conductive layers 20a, 20b as described later on.

YDC is the mixed conductor in which both of the oxide ion conduction and the electron conduction occur. The mixed conductor as described above contributes to the quick oxide ion conduction from the cathode 14 to the anode 12. Further, the mixed conductor facilitates the reaction to produce water and electrons in accordance with the bonding between the oxide ion and hydrogen in the anode 12. That is, the electrode reaction is facilitated, and the power generation performance of the fuel cell is further improved.

The electrolyte-electrode assembly 18 constructed as described above is interposed between a pair of separators 22a, 22b. Collecting electrodes 24a, 24b are arranged outside of the separators 22a, 22b respectively. End plates 26a, 26b are further arranged outside of the collecting electrodes 24a, 24b (see FIG. 1). The end plates 26a, 26b are connected to one another by unillustrated bolts, and the electrolyte-electrode assembly 18, the separators 22a, 22b, and the collecting electrodes 24a, 24b are interposed between the end plates 26a, 26b. Accordingly, the power-generating cell 10 is constructed. Gas flow passages 28a, 28b are formed for the separators 22a, 22b respectively in order to supply the fuel gas or the oxygen-containing gas to the anode 12 or the cathode 14.

The electrolyte-electrode assembly 18 according to the embodiment of the present invention is basically constructed as described above. Next, its function and effect will be explained.

When the power-generating cell 10 constructed as described above is operated, the temperature of the power-generating cell 10 is raised to about 500° C. to 800° C. After that, the oxygen-containing gas is allowed to flow through the gas flow passage 28b provided for the separator 22b. On the other hand, the fuel gas containing hydrogen is allowed to flow through the gas flow passage 28a provided for the separator 22a.

The oxygen contained in the oxygen-containing gas combines with the electron in the cathode 14 composed of Pt to produce the oxide ion ($O^{2-}$). The produced oxide ion is migrated from the cathode 14 toward the electrolyte 16.

Figure 4:
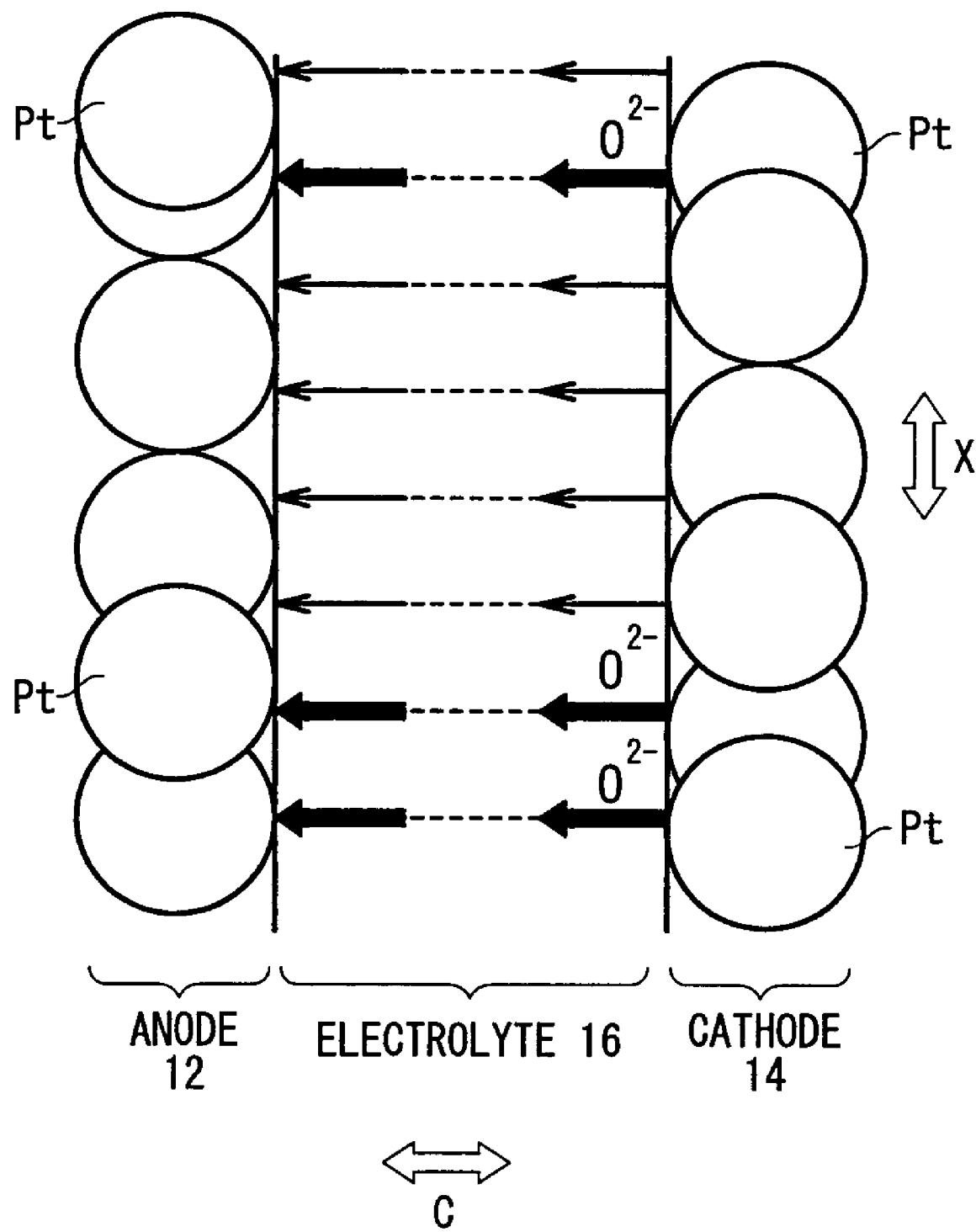
FIG. 4 is a magnified view illustrating major parts of an electrolyte-electrode assembly provided without an isotropic conductive layer.

FIG. 4 shows a magnified joined portion between the cathode 14 and the electrolyte 16 in an electrolyte-electrode assembly constructed in the same manner as the electrolyte-electrode assembly 18 except that the isotropic conductive layers 20a, 20b are absent. In FIGS. 3 and 4, large arrows having large widths indicate the passages through which the oxide ion can be conducted, while small arrows having small widths indicate the passages through which the oxide ion cannot be conducted. In this arrangement, the electrolyte 16 is joined to the cathode 14 via the tops of the projections.

The electrolyte 16 is composed of the substance which exhibits anisotropy for the oxide ion conduction. Therefore, the conduction passages, through which the oxide ions are conducted in specified directions, are formed in the electrolyte 16. When the Pt particles, which constitute the anode 12 and the cathode 14, make contact with the both ends of the conduction passage, the oxide ion conduction occurs as indicated by the large arrow in FIG. 4. On the contrary, when the Pt particle is absent at the end of the conduction passage, the ion conduction cannot be achieved from the cathode 14 via the electrolyte 16 to the anode 12 as indicated by the small arrow in FIG. 4. That is, the conduction passages are limited, and hence the ion conductivity is decreased.

Accordingly, in the embodiment of the present invention, the isotropic conductive layers 20a, 20b are provided in order to conduct the oxide ion even when the Pt particle is absent at the end of the conduction passage.

Specifically, in the embodiment of the present invention, as shown in FIGS. 2 and 3, the isotropic conductive layers 20a, 20b, in which the oxide ion conduction exhibits isotropy, are provided. Therefore, the oxide ion is firstly migrated from the cathode 14 to the isotropic conductive layer 20b, and the oxide ion is randomly migrated through the isotropic conductive layer 20b. Thus, the oxide ion can be directed to the portion at which the electrolyte 16 makes contact with the isotropic conductive layer 20b. As a result, not only the oxide ion which is migrated straightly through the isotropic conductive layer 20b but also the oxide ion which is migrated obliquely enters the electrolyte 16. That is, the number of the oxide ions which enter the electrolyte 16 is significantly increased.

As described above, the number of the oxide ions capable of being migrated from the cathode 14 to the electrolyte 16 is increased. As a result, the oxide ion conductivity is improved. This feature may also apply to the anode 12 in the same manner as described above. Therefore, the electrolyte-electrode assembly 18 exhibits excellent power generation performance.

Further, in this arrangement, the interface reaction resistance is decreased between the electrolyte 16 and both of the electrodes 12, 14, and hence the overvoltage is decreased. For the reason as described above, the power-generating cell 10 (fuel cell) exhibiting excellent power generation performance is obtained.

The oxide ion, which is migrated to the anode 12, is combined with the hydrogen which is contained in the fuel gas supplied to the anode 12. As a result, water and electrons are released. The released electron is taken out to an external circuit electrically connected to the collecting electrodes 24a, 24b, and the electron is utilized as the DC electric energy for energizing the external circuit. After that, the electron arrives at the cathode 14, and the electron combines with the oxygen which is supplied to the cathode 14.

As described above, the isotropic conductive layers 20a, 20b are composed of YDC as the mixed conductor. Therefore, the ionization reaction in the cathode 14 and the water-producing reaction in the anode 12 are facilitated. Therefore, the power-generating cell 10 exhibits particularly excellent power generation performance.

The electrolyte-electrode assembly 18 of the self-standing membrane type is manufactured, for example, as follows. At first, single crystal of $La_{9.33}Si_6O_{26}$ is obtained by effecting the growth while orientating the crystal growth direction in the c-axis direction. In order to effect the orientation as described above, for example, it is preferable to adopt a method described in Japanese Laid-Open Patent Publication No. 11-130595.

Subsequently, YDC in a paste form is applied to both end surfaces which perpendicularly intersects with the c-axis direction of the obtained single crystal. The application may be performed in accordance with a known method such as the screen printing method. The applied paste is calcined, and thus the isotropic conductive layers 20a, 20b composed of YDC are formed.

Subsequently, Pt in a paste form is applied to the other respective end surfaces. The application may be performed, for example, in accordance with the screen printing method in the same manner as described above. The paste is calcined, and thus the anode 12 and the cathode 14 composed of Pt are constructed. That is, the electrolyte-electrode assembly 18 (see FIG. 1) is obtained, which has the electrolyte 16 is single crystal composed of $La_{9.33}Si_6O_{26}$ having the c-axis direction as the thickness direction and which comprises the isotropic conductive layers 20a, 20b provided between the anode 12 and the cathode 14 composed of Pt.

$La_{9.33}Si_6O_{26}$, which constitutes the electrolyte 16, is not specifically limited to single crystal, which may be a sintered member in which the respective crystals of the powder are oriented in the c-axis direction. Such a sintered member is obtained, for example, as follows. That is, the powder of $La_{9.33}Si_6O_{26}$ is added to a solvent to prepare a slurry. After that, the slurry is solidified to obtain a formed product in the presence of a strong magnetic field of about 10 T (tesla), and the formed product is sintered.

The material for the electrolyte 16 is not especially limited to $La_{9.33}Si_6O_{26}$. On condition that the material is any substance in which the oxide ion conduction exhibits anisotropy, another apatite type oxide is also available, and a series of BIMEVOX compounds, which are also layered compounds, are also available.

Similarly, the material for the isotropic conductive layers 20a, 20b is not especially limited to YDC. On condition that the material is any substance in which the oxide ion conduction exhibits isotropy, another fluorite type oxide is also available, and any perovskite type oxide is also available.

In order to construct the power-generating cell 10 with the electrolyte-electrode assembly 18, the separators 22a, 22b, the collecting electrodes 24a, 24b, and the end plates 26a, 26b are arranged on the respective end surfaces of the anode 12 and the cathode 14.

When the electrolyte-electrode assembly 18 is constructed as the electrode-supported membrane type, the following steps may be carried out. That is, at first, a powder containing Pt (for example, Pt—YSZ, Pt—SDC, and Pt-apatite compound) is press formed to prepare a formed product.

Subsequently, YDC in a paste form is applied to one end surface of the formed product, for example, in accordance with the screen printing method. Further, an apatite type oxide (for example, $La_{9.33}Si_6O_{26}$) in a paste form is stacked on the YDC in the paste form, for example, in accordance with the screen printing method.

Subsequently, the entire formed product is placed stationarily in a strong magnetic field of about 10 T before the apatite type oxide in the paste form is dried. Accordingly, the apatite type electrolyte is oriented in the c-axis direction.

Subsequently, a firing treatment is carried out the YDC in the paste form and the apatite type oxide in the paste form together with the formed product. Accordingly, a Pt sintered product (used for the anode 12 as a cermet of the like) is obtained, which has one end surface on which the isotropic conductive layer 20a composed of YDC and the electrolyte 16 composed of the apatite type oxide are stacked.

YDC in a paste form is applied to the electrolyte 16 obtained as described above, for example, in accordance with the screen printing method in the same manner as described above. A Pt paste is applied to the YDC in the paste form, for example, in accordance with the screen printing.

Subsequently, a firing treatment is applied to the YDC in the paste form and the Pt paste together with the anode 12, the isotropic conductive layer 20a, and the electrolyte 16. Accordingly, the electrolyte-electrode assembly 18 is obtained, in which the isotropic conductive layer 20b composed of YDC and the cathode 14 composed of Pt are formed, and the isotropic conductive layer 20a, the electrolyte 16, the isotropic conductive layer 20b, and the cathode 14 are provided on the anode 12. Of course, the electrode, which has been produced beforehand, may be used as the cathode 14.

In the steps as described above, it is possible to appropriately select the layers to be simultaneously fired. That is, for example, the following procedure is also available. A stack of a powder containing Pt and YDC in a paste form is sintered simultaneously to obtain a stack of the anode 12 and the isotropic conductive layer 20a. After that, an apatite type oxide in a paste form, which is to be used as the electrolyte 16, is stacked on the stack. Alternatively, it is also allowable that a sintering treatment is performed at once for all layers after stacking all of the layers to form the electrolyte-electrode assembly 18.

In the embodiment described above, the isotropic conductive layers 20a, 20b are provided on both sides of the anode 12 and the cathode 14. However, only the isotropic conductive layer 20a may be provided on the side of the anode 12, and only the isotropic conductive layer 20b may be provided on the side of the cathode 14. It is preferable that the isotropic conductive layer 20b is provided at least on the side of the cathode 14.

The material for the electrode is not especially limited to Pt in the self-standing membrane type or the electrode-supported membrane type. A metal or metals, which function as the catalyst such as Ni and Cu, may be used singly or in composite for the electrode material. Alternatively, for example, $La_{0.8}Sr_{0.2}MnO_3$ (LSM) may be adopted as the material for the cathode, and a ceramic material or a cermet such as Ni—YSZ may be adopted as the material for the anode.

EXAMPLE 1

Single crystal of $La_{9.33}Si_6O_{26}$ with the crystal oriented in the c-axis direction were prepared and processed into a pellet form having a diameter of 30 mm and a thickness of 1 mm. The c-axis direction was designated as the thickness direction.

A paste of YDC was applied to both end surfaces of the pellet in accordance with the screen printing method, followed by being dried at 120° C. for 1 hour. Further, the materials were retained at 1,450° C. for 4 hours. Thus, YDC was calcined on the pellet to form isotropic conductive layers 20a, 20b composed of YDC. Each of the isotropic conductive layers 20a, 20b had a diameter of 28 mm and a thickness of 8 μm.

Subsequently, a paste of Pt was applied onto the isotropic conductive layers 20a, 20b in accordance with the screen printing method. The materials were dried at 120° C. for 1 hour, followed by being retained at 1,000° C. for 1 hour to calcine Pt on YDC thereby. Thus, an anode 12 and a cathode 14 composed of Pt were formed. That is, an electrolyte-electrode assembly 18 was obtained. This is designated as Example 1.

COMPARATIVE EXAMPLE 1

An electrolyte-electrode assembly was manufactured in the same manner as in Example 1 except that the isotropic conductive layers 20a, 20b were not provided for the purpose of comparison. This is designated as Comparative Example 1.

COMPARATIVE EXAMPLE 2

An electrolyte-electrode assembly was produced in the same manner as in Example 1 except that YSZ, in which the oxide ion conduction exhibited isotropy, was used for an electrolyte. This is designated as Comparative Example 2.

COMPARATIVE EXAMPLES 3 AND 4

Electrolyte-electrode assemblies were produced in the same manner as in Example 1 except that single crystal of $La_{9.33}Si_6O_{26}$ or YSZ was used for an electrolyte, a cathode was composed of LSM, an anode was composed of Ni—YSZ, and no isotropic conductive layer was provided. These are designated as Comparative Examples 3 and 4 respectively.

Figure 5:
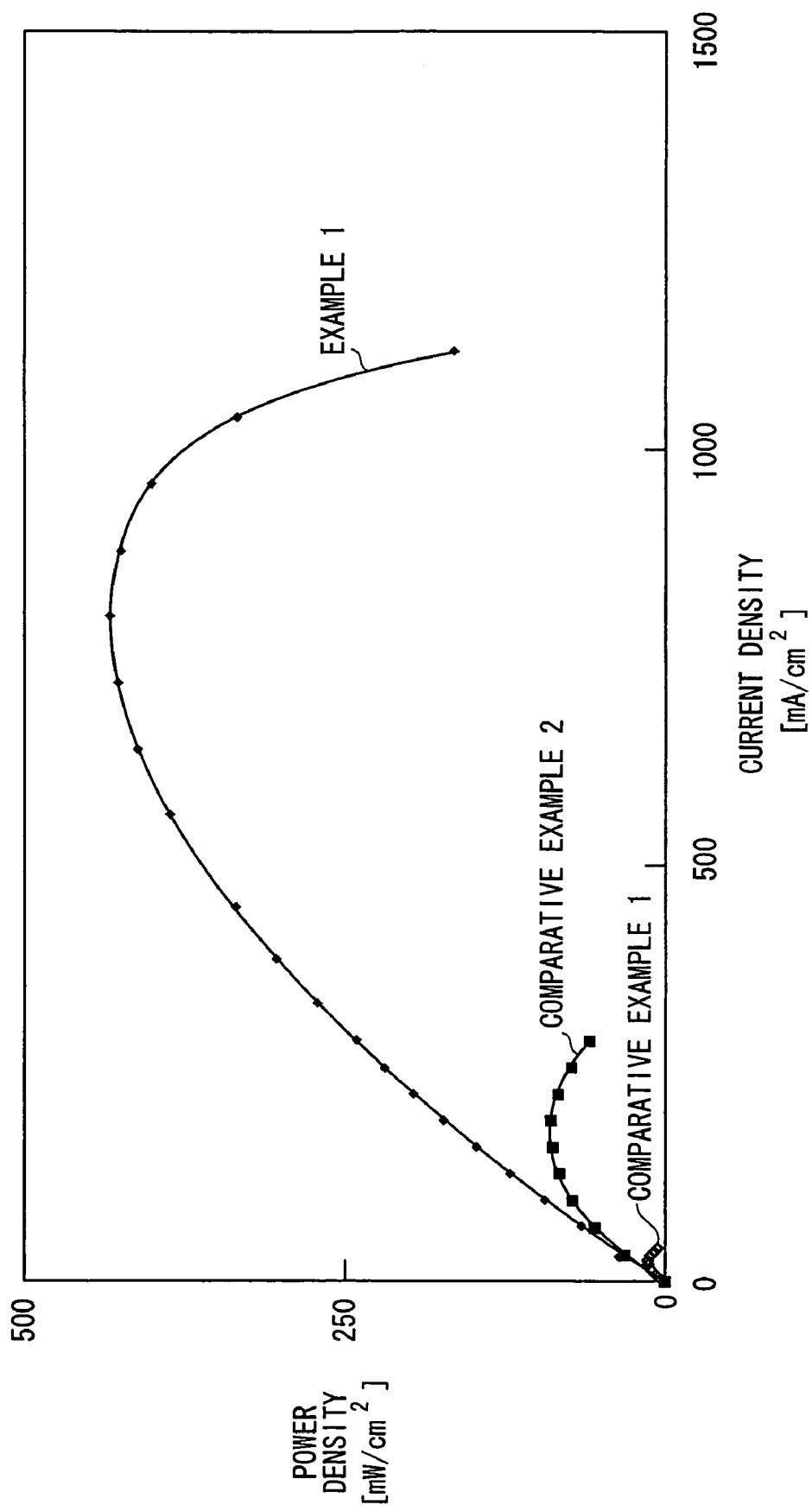
FIG. 5 is a graph illustrating the relationship between the current density and the power density in relation to electrolyte-electrode assemblies of Example 1 and Comparative Examples 1 and 2.
Figure 6:
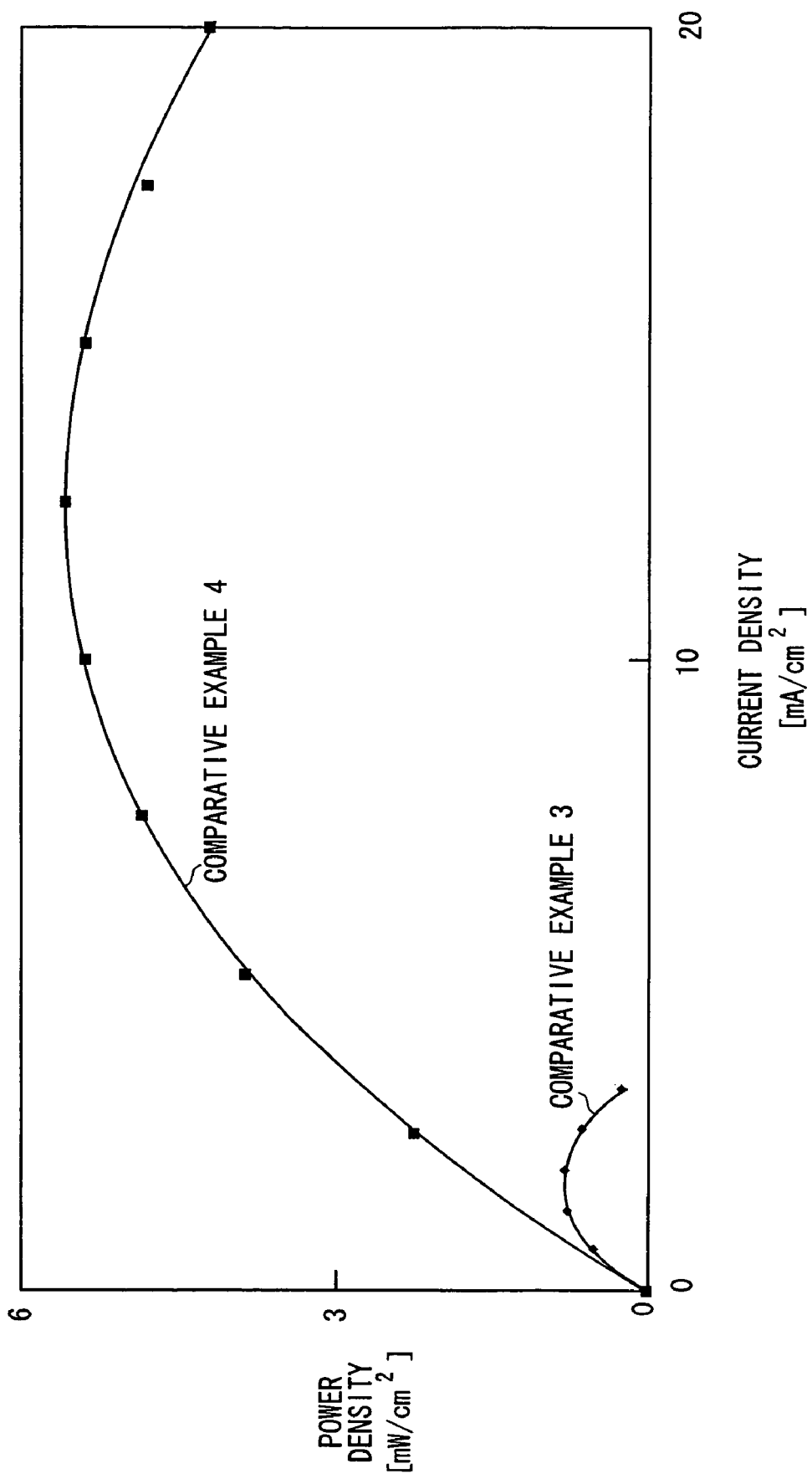
FIG. 6 is a graph illustrating the relationship between the current density and the power density in relation to electrolyte-electrode assemblies of Comparative Examples 3 and 4.

The power generation was caused by allowing the air to flow to the cathode at 150 cc/minute and allowing the hydrogen to flow to the anode at 50 cc/minute at 800° C. by using the respective electrolyte-electrode assemblies of Example 1 and Comparative Examples 1 to 4 described above to investigate the relationship between the current density and the power density. Results are shown in FIGS. 5 and 6. According to the comparison between Example 1 and Comparative Examples 1 and 2 (see FIG. 5), it is clear that the power density is significantly improved by providing the isotropic conductive layer and using, as the electrolyte, the substance in which the oxide ion conduction exhibits anisotropy.

FIG. 6 shows a graph illustrating the relationship between the current density and the power density in relation to the electrolyte-electrode assemblies of Comparative Examples 3 and 4. The scales of the horizontal axis and the vertical axis are extremely small as compared with FIG. 5. That is, it can be confirmed that the power density is further decreased as compared with Comparative Examples 1 and 2.

Figure 7:
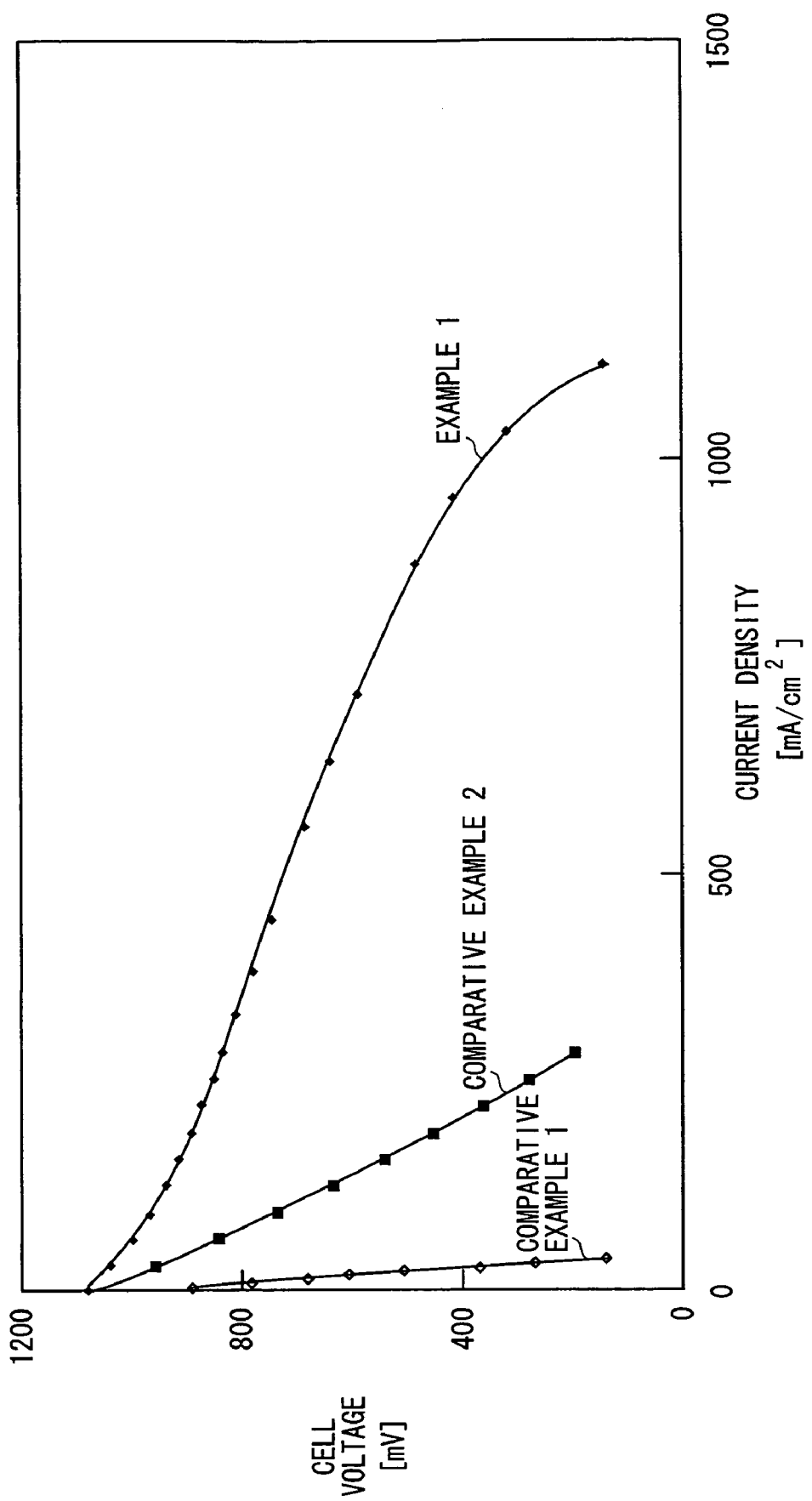
FIG. 7 is a graph illustrating the relationship between the current density and the cell voltage in relation to the electrolyte-electrode assemblies of Example 1 and Comparative Examples 1 and 2.
Figure 8:
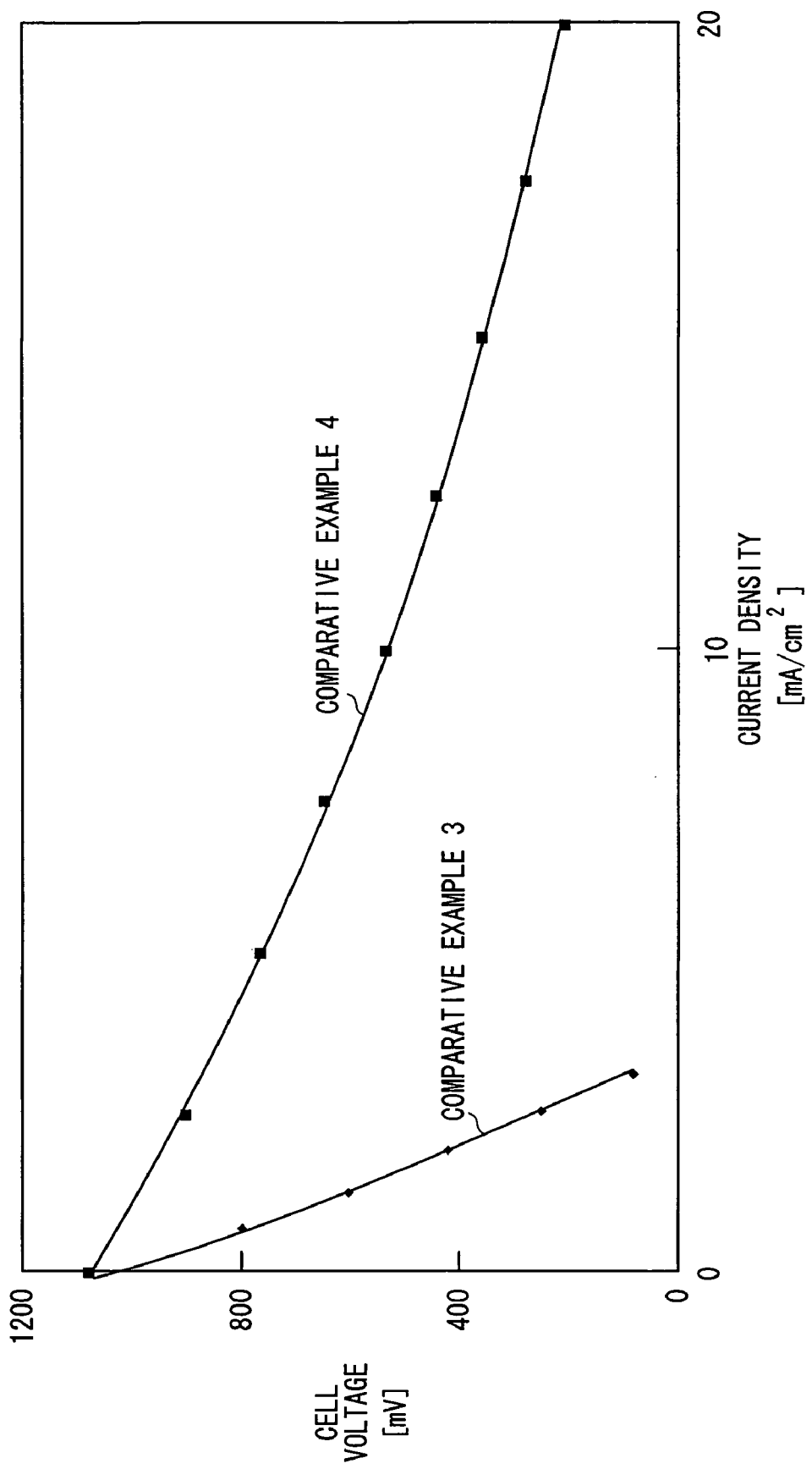
FIG. 8 is a graph illustrating the relationship between the current density and the cell voltage in relation to the electrolyte-electrode assemblies of Comparative Examples 3 and 4.

The relationship between the current density and the cell voltage at 800° C. was investigated for the electrolyte-electrode assemblies of Example 1 and Comparative Examples 1 to 4. Results are shown in FIGS. 7 and 8. When the curve of Example 1 is compared with the curves of the Comparative Examples 1 and 2 in FIG. 7, the following results were clarified. That is, the cell voltage is retained at higher levels even when the current density is increased, by providing the isotropic conductive layer and using, as the electrolyte, the substance in which the oxide ion conduction exhibits anisotropy. In other words, the interface reaction resistance is low, and hence the overvoltage is relatively low.

In these experiments, as shown in FIG. 8, the cell voltage is further decreased in the electrolyte-electrode assemblies of Comparative Examples 3 and 4 as compared with Comparative Examples 1 and 2.

Subsequently, Cole-Cole plots were prepared for the respective electrolyte-electrode assemblies of Example 1 and Comparative Example 1. When the plotted dots are connected to one another, a circular arc-shaped curve is obtained. Both ends of the curve are subjected to extrapolation to obtain two points of intersection with respect to the horizontal axis. The difference between the two points corresponds to the interface reaction resistance. That is, the shorter the distance between the two point is, the lower the interface reaction resistance is, which means that the overvoltage of the substance, generated at the electrode interface, is low.

Figure 9:
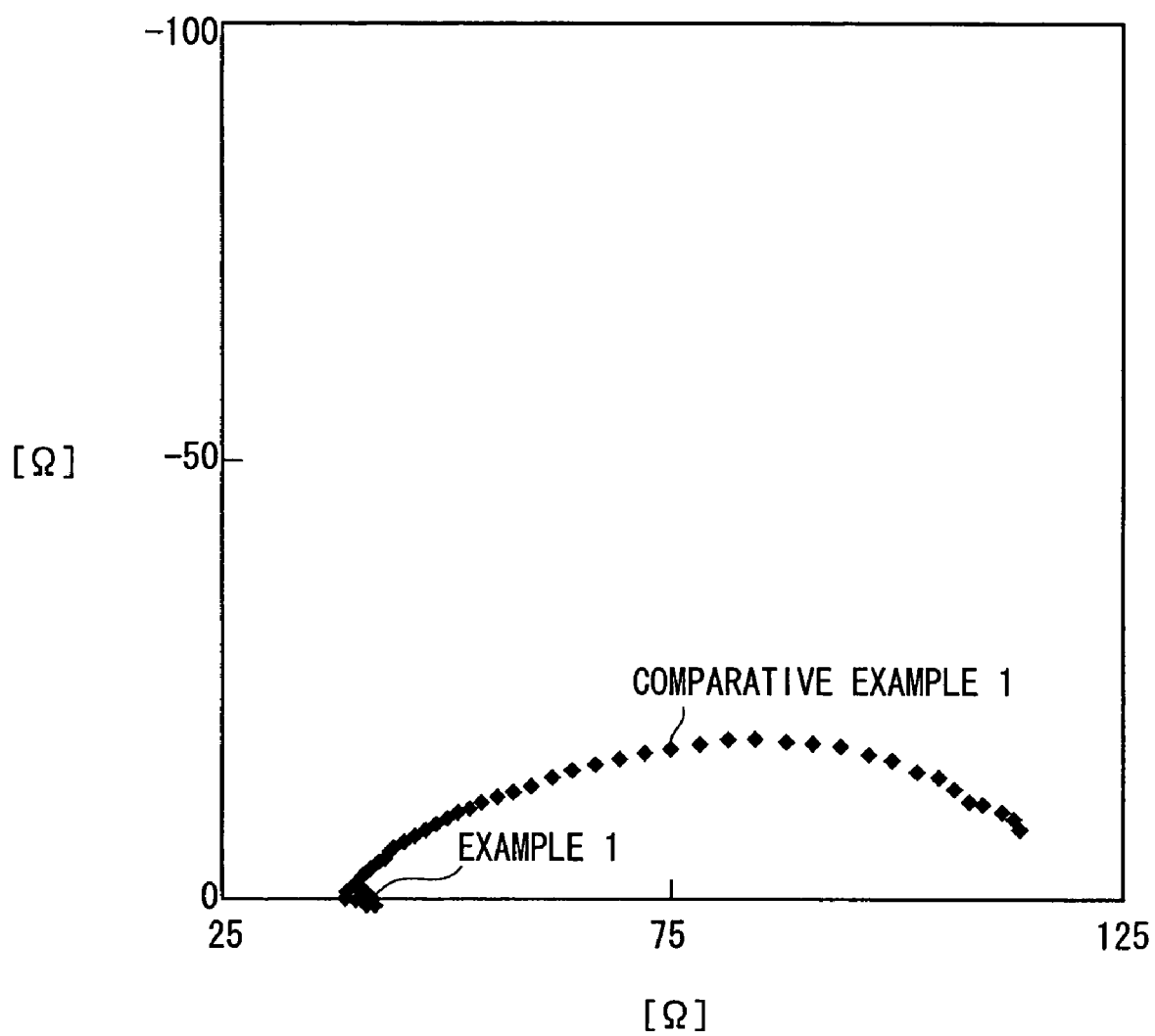
FIG. 9 is a Cole-Cole plot in relation to the electrolyte-electrode assemblies of Example 1 and Comparative Example 1.

The plot results of Example 1 and Comparative Example 1 are shown in combination in FIGS. 9 and 10. According to FIGS. 9 and 10, the following is confirmed. That is, the interface reaction resistance is extremely low for the curve of Example 1 as compared with the curve of Comparative Example 1. In other words, the electrolyte-electrode assembly 18 of Example 1 is a substance which is particularly excellent in the power generation performance. As described above, when the isotropic conductive layers 20a, 20b are provided, the electrolyte-electrode assembly exhibiting excellent power generation performance is obtained.

The electrolyte-electrode assembly according to the present invention is preferably usable, for example, when the power-generating cell of the fuel cell is constructed.

Although certain preferred embodiments of the present invention have been shown and described in detail, it should be understood that various changes and modifications may be made therein without departing from the scope of the appended claims.

What is claimed is:

1. An electrolyte-electrode assembly comprising an electrolyte interposed between an anode and a cathode,
    wherein said electrolyte is composed of an apatite type oxide which contains a trivalent element and a tetravalent element, which has a composition formula represented by $A_xB_6O_{12+1.5x}$ provided that A shows said trivalent element, B shows said tetravalent element $8 \leq x \leq 10$, which has crystals belonging to a hexagonal system, and which provides migration of an oxide ion along a c-axis direction in said crystals thereof when a single crystal is oriented to the c-axis direction so that oxide ion conductivity in the c-axis is higher than oxide ion conductivity in another plane or direction, whereby oxide ion conduction exhibits anisotropy;
    wherein said electrolyte is a single crystal in which the crystal is oriented in said plane or said direction of said migration of said oxide ion, and said anode and said cathode are arranged perpendicular to a plane or a direction in which said oxide ion conduction of said electrolyte is high; and
    an isotropic conductive layer, in which said oxide ion conduction exhibits isotropy, is provided between said electrolyte and at least one of said anode and said cathode.

2. The electrolyte-electrode assembly according to claim 1, wherein said isotropic conductive layer is composed of a fluorite type oxide or a perovskite type oxide.

3. The electrolyte-electrode assembly according to claim 1, wherein said isotropic conductive layer is composed of a mixed conductor which exhibits both oxide ion conduction and electron conduction.

4. The electrolyte-electrode assembly according to claim 1, wherein said trivalent element is La.

5. The electrolyte-electrode assembly according to claim 4, wherein said tetravalent element is Si or Ge.

6. An electrolyte-electrode assembly comprising an electrolyte interposed between an anode and a cathode,
    wherein said electrolyte is composed of an apatite type oxide which contains a trivalent element and a tetravalent element, which has a composition formula represented by $A_xB_6O_{12+1.5x}$ provided that A shows said trivalent element, B shows said tetravalent element $8 \leq x \leq 10$, which has crystals belonging to a hexagonal system, and which provides migration of an oxide ion along a c-axis direction in said crystals thereof when a single crystal is oriented to the c-axis direction so that oxide ion conductivity in the c-axis is higher than oxide ion conductivity in another plane or direction, whereby oxide ion conduction exhibits anisotropy;
    wherein said electrolyte is a single crystal in which the crystal is oriented in said plane or said direction of said migration of said oxide ion, and said anode and said cathode are arranged perpendicular to a plane or a direction in which said oxide ion conduction of said electrolyte is high; and
    a layer, which has an oxide ion conductivity lower than that of said electrolyte, is provided between said electrolyte and at least one of said anode and said cathode.

7. The electrolyte-electrode assembly according to claim 6, wherein said trivalent element is La.

8. The electrolyte-electrode assembly according to claim 7, wherein said tetravalent element is Si or Ge.

9. The electrolyte-electrode assembly according to claim 6, wherein said layer is composed of a substance in which oxide ion conduction exhibits isotropy.

10. The electrolyte-electrode assembly according to claim 6, wherein said layer is composed of a fluorite type oxide or a perovskite type oxide.

11. The electrolyte-electrode assembly according to claim 6, wherein said layer is composed of a mixed conductor which exhibits both oxide ion conduction and electron conduction.

12. A method for producing an electrolyte-electrode assembly comprising an electrolyte interposed between an anode and a cathode, said method comprising:
    preparing said electrolyte composed of a substance which provides a plane or a direction of migration of oxide ion in a crystal thereof when said substance is single crystal so that oxide ion conduction exhibits anisotropy thereby;

providing, on at least one end surface of said electrolyte, an isotropic conductive layer in which oxide ion conduction exhibits isotropy; and arranging at least one of said anode and said cathode on said electrolyte or said isotropic conductive layer;

wherein said electrolyte is composed of an apatite type oxide which contains a trivalent element and a tetravalent element, which has a composition formula represented by $A_xB_6O_{12+1.5x}$ provided that A shows said trivalent element, B shows said tetravalent element, $8 \leqq x \leqq 10$, which has crystals belonging to a hexagonal system, and which provides migration of an oxide ion along a c-axis direction in said crystals thereof when a single crystal is oriented to the c-axis direction so that oxide ion conductivity in the c-axis is higher than oxide ion conductivity in another plane or direction, whereby oxide ion conduction exhibits anisotropy; and wherein said electrolyte is a single crystal in which the crystal is oriented in said plane or said direction of said migration of said oxide ion, and said anode and said cathode are arranged perpendicular to a plane or a direction in which said oxide ion conduction of said electrolyte is high.

13. The method for producing said electrolyte-electrode assembly according to claim 12, wherein said isotropic conductive layer is prepared with a fluorite type oxide or a perovskite type oxide.

14. The method for producing said electrolyte-electrode assembly according to claim 12, wherein said isotropic conductive layer is prepared with a mixed conductor which exhibits both oxide ion conduction and electron conduction.

15. A method for producing an electrolyte-electrode assembly comprising an electrolyte interposed between an anode and a cathode, said method comprising:

a first step of providing any one of said anode and said cathode;

a second step of providing said electrolyte composed of a substance which provides a plane or a direction of migration of oxide ion in crystals thereof so that oxide ion conduction exhibits anisotropy thereby; and a third step of providing the other one of said anode and said cathode, wherein a step of providing an isotropic conductive layer in which oxide ion conduction exhibits isotropy is carried out at least between said first step and said second step or between said second step and said third step, wherein said electrolyte is composed of an apatite type oxide which contains a trivalent element and a tetravalent element, which has a composition formula represented by $A_xB_6O_{12+1.5x}$ provided that A shows said trivalent element, B shows said tetravalent element $8 \leqq x \leqq 10$, which has crystals belonging to a hexagonal system, and which provides migration of an oxide ion along a c-axis direction in said crystals thereof when a single crystal is oriented to the c-axis direction so that oxide ion conductivity in the c-axis is higher than oxide ion conductivity in another plane or direction, whereby oxide ion conduction exhibits anisotropy; and wherein said electrolyte is a single crystal in which the crystal is oriented in said plane or said direction of said migration of said oxide ion, and said anode and said cathode are arranged perpendicular to a plane or a direction in which said oxide ion conduction of said electrolyte is high.

16. The method for producing said electrolyte-electrode assembly according to claim 15, wherein said isotropic conductive layer is prepared with a fluorite type oxide or a perovskite type oxide.

17. The method for producing said electrolyte-electrode assembly according to claim 16, wherein said isotropic conductive layer is prepared with a mixed conductor which exhibits both oxide ion conduction and electron conduction.

* * * * *